United States Patent [19]
Le Van Suu

[11] Patent Number: 5,764,948
[45] Date of Patent: Jun. 9, 1998

[54] METHOD AND APPARATUS FOR DETERMINING A COMPOSITION OF AN INTEGRATED CIRCUIT

[75] Inventor: Maurice Gilbert Le Van Suu, Romainville, France

[73] Assignee: SGS-Thomson Microelectronics S.A., Saint Genis, France

[21] Appl. No.: 233,393

[22] Filed: Apr. 26, 1994

[30] Foreign Application Priority Data

Apr. 29, 1993 [FR] France .................. 93 05082

[51] Int. Cl.$^6$ ........................... B06F 13/00
[52] U.S. Cl. .............. 395/500; 364/578; 364/488; 364/489; 364/490; 395/672; 395/673; 395/677; 395/800.36
[58] Field of Search ............... 364/488, 489, 364/490, 491, 578; 395/800, 500, 674, 675, 677, 595, 842, 562, 564, 588, 382, 384, 800.21, 183.09, 800.27, 670, 673, 672, 705, 685, 676, 497.04, 445, 701, 706, 800.36; 371/22.4

[56] References Cited

U.S. PATENT DOCUMENTS

| | | | |
|---|---|---|---|
| 4,229,815 | 10/1980 | Cummiskey | 370/84 |
| 4,667,319 | 5/1987 | Chum | 370/97 |
| 4,761,800 | 8/1988 | Lese et al. | 375/117 |
| 4,894,847 | 1/1990 | Tjahjadi et al. | 370/84 |
| 4,965,718 | 10/1990 | George et al. | 395/478 |
| 4,980,824 | 12/1990 | Tulpule et al. | 395/650 |
| 5,136,528 | 8/1992 | Fordham et al. | 364/578 |
| 5,144,666 | 9/1992 | Le Van Suu | 380/38 |
| 5,187,796 | 2/1993 | Wang et al. | 395/800 |
| 5,202,975 | 4/1993 | Rasbold et al. | 395/500 |
| 5,202,993 | 4/1993 | Tarsy et al. | 395/700 |
| 5,325,510 | 6/1994 | Frazier | 395/800 |
| 5,325,526 | 6/1994 | Cameron et al. | 395/650 |
| 5,359,537 | 10/1994 | Saucier et al. | 364/489 |

(List continued on next page.)

FOREIGN PATENT DOCUMENTS

| | | |
|---|---|---|
| A-0049917 | 4/1982 | European Pat. Off. |
| A-0175657 | 3/1986 | European Pat. Off. |
| A-0257776 | 3/1988 | European Pat. Off. |
| A-0301736 | 2/1989 | European Pat. Off. |
| A-2553950 | 4/1985 | France. |
| A-2213967 | 8/1989 | United Kingdom. |

OTHER PUBLICATIONS

Gong et al "Performance evaluation for application—specific architectures", 1995 IEEE.

Maekawa et al "Near fine grain parallel processing of circuit simulation using direct method", 1995 IEEE.

Jensen et al "On synthesizing application—specific array architectures from behavioral specifications", 1993 IEEE.

DeGloria et al "ASIC and board design of a high performance parallel architecture" 1992 IEEE.

Lee et al "The implementation of a PC–based list processor for symbolic computation" 1990 IEEE.

Dou "A high–parallel match architecture for AI production systems using application-specific associative matching processors" 1993 IEEE.

Hashimoto et al "Pratical Scheduling and fine optimization technology for ASIC manufacturing lines" 1993 IEEE.

Ramakrishna et al "Storage allocation strategies for data path synthesis of ASICS".

(List continued on next page.)

*Primary Examiner*—Jacques Louis-Jacques
*Attorney, Agent, or Firm*—Wolf, Greenfield & Sacks, P.C.; James H. Morris; John N. Anastasi

[57] ABSTRACT

A method and apparatus for assisting in the design of integrated circuits, which includes simulating functions, to be executed by the integrated circuit, in a parallel architecture machine comprising "Transputers." An allocation of the resources of this parallel architecture machine is monitored in order to assess performance characteristics of the ASIC circuit to be designed.

16 Claims, 4 Drawing Sheets

U.S. PATENT DOCUMENTS

| | | | |
|---|---|---|---|
| 5,379,428 | 1/1995 | Belo | 395/650 |
| 5,384,710 | 1/1995 | Lam et al. | 364/489 |
| 5,438,680 | 8/1995 | Sullivan | 395/800 |
| 5,465,368 | 11/1995 | Davidson et al. | 395/800 |

OTHER PUBLICATIONS

Patent Abstracts of Japan, vol. 9, No. 79 (P–0347)(1802) Nov. 27, 1984 & JP–A–59208603 (Hitachi Seisakusho) May 13, 1983.

Electronique Radio Plans, No. 521, Apr. 19991, Paris, France, pp. 61–67, B. Delabre et al., "Le 2D bus".

28th ACM/IEEE Design Automation Conference Jun. 17–21, 1991 San Francisco, CA, US, pp. 526–529, Dutt et al, "Bridging High–Level Synthesis to RTL Technology Libraries".

Wescon Conference Record, vol. 34, Nov. 1990, North Hollywood, US, pp. 382–387, Lindeman, "Top–Down Design Symthesis Using VDHL" Electronics, vol. 63, No. 4, Apr. 1990, New York, US, pp. 59–60.

26th AMC IEEE Design Automation Conference Jun. 25–29, Las Vegas Convention Center, US, pp. 308–313, Kewtzer, "Three Competing Design Methodologies for ASIC'S: Architectural synthesis, Logic Synthesis and Module Generation".

"On the Horizon: fast chips quickly", IEEE, Mar. 1984, By P. Wallich, pp. 28–34.

"PSI: A Silicon Compiler For Very Fast Protocol Processing", IFIP Workshop on Protocols for High–Speed Netowrks, 1989, By H. Abu–Amara et al., pp. 181–195, Jan. 1989.

"Silicon compiler lets system makers design their own VLSI chips" Electronic Design, Oct. 1984, By S. Johnson, pp. 167–181.

"Semiautomatic Implementation of Communication Protocols", IEEE Transactions on Software Engineering, vol. SE–13, No. 9, Sep. 1987, By G. Bochmann et al., pp. 989–999.

EDN Electrical Design News, vol. 36, No. 11, 23 May 1991, Newton, MA, "Data line senses remote shorts".

METHOD AND APPARATUS FOR DETERMINING A COMPOSITION OF AN INTEGRATED CIRCUIT

BACKGROUND OF THE INVENTION

1. Field of the Invention An object of the present invention is a method and apparatus to determine a composition of an integrated circuit to be manufactured. It relates chiefly to "Applications Specific Integrated Circuits" or ASICs provided with an arithmetic and/or logic unit, a program memory and one or more working registers. An object of the invention is to manufacture specific-purpose integrated circuits such as these that are simpler and that, as a result of this specific nature, cost less than circuits of a more powerful, universal type. In addition it is a further object to make designing of these circuits automatic.

2. Description of the Related Art

In current uses, an engineer responsible for automation of an electronic control system has essentially two options available to him. Either he makes a wired circuit integrating all logic functions or he utilizes a microprocessor-based system which, by virtue of its principle, comprises an arithmetic and logic unit, a program memory and working registers. The latter approach is becoming more widespread even though, in certain cases, it is not always indispensable. However, the implementation of this latter technique has fundamental drawbacks.

To achieve an application with a microprocessor-based system, the designer must first of all choose the type of microprocessor with which he wishes to work. From among the different microprocessors available in the market, in theory he chooses the one that appears to be most suited to his requirement. In practice, however it is seen that he chooses essentially the circuit that he knows best, without this circuit's being particularly suited to his requirement. Using the specifications of the circuit concerned, he sets up his application, namely a program that will ultimately be loaded into the program memory of this microprocessor circuit and will condition its operation.

When there is a range of microprocessors, there is a great temptation to choose the most powerful unit in this range for any application, so as to be sure of being able to achieve all the functions envisaged in the application. Obviously, the most powerful circuit is also the most expensive one, and it is not possible to envision working with a simplistic form of reasoning such as is the case when the application is designed to be used in a very large number of instruments. For example, in the automobiles sector, a case may be imagined where a microprocessor mounted on a flashlight of a vehicle would have to be simplified to the utmost in order be made inexpensive.

In this case, the designer responsible for determining the specific-purpose circuit runs the risk, if he chooses a microprocessor that is far too powerful, of ending up with a product that is far too costly or, if he chooses a microprocessor that is not powerful enough, of having to recommence the definition of the circuit several times until he finds the right one. Furthermore, in a family of microprocessors, it is possible that certain specific features of the family are incompatible with a desired operation keep a future circuit to be designed. This fact may even not appear very clearly at the outset of the design process and may lead to a loss of time when the specific-purpose circuit is being studied. This case arises most notably when it is discovered that the complexity of the tasks that the microprocessor must be made to perform ultimately requires the defining of a time delay keep requiring with, for example, more bits than are contained in the standard time delay keep of the family of microprocessors chosen. A time delay value is a sequence of bits that conditions the various operations carried out by a microprocessor during a working cycle.

One of the particular features of currently known microprocessors is that they are not multiple-task microprocessors. The present-day operation of independent microprocessors is organized around the concept of the level of interruption. A task with a higher level of interruption will always be carried out to completion in preference to a task with a lower level of interruption. In practice, when the microprocessor is carrying out a task with a subordinate level of interruption and when it is confronted with a task having a higher hierarchical level, it interrupts the subordinate task in order to carry out the higher-level task. Then, at the end of the performance of the higher-level task, the subordinate task is resumed at the point at which it was interrupted. The operation, in this case, of the microprocessor is not a multiple-task operation but rather a time-sharing operation.

In one example that shall be referred to hereinafter, an approach is considered wherein, in the field of automated home installations, control and/or indicating signals are sent through an electrical distribution network by a carrier current. In view of the different existing protocols, there are known ways of placing a bit-checking device in each apparatus thus connected to the electrical supply network. In reception mode, the bit-checking device ascertains that the presentation of the received bits conforms to an established protocol. In transmission mode, the bit-checking device ascertains that the bits being transmitted by the apparatus are also transmitted in accordance with this protocol. In French patent application No. 9205423, filed on 30th Apr. 1992, the present applicant disclosed a system wherein it is the microprocessor of the apparatus that is made to carry out this bit-checking operation. In French patent application No. 92 15039 filed on 14th Dec. 1992, the same Applicant disclosed a system using a microprocessor-based "applications specific circuit" capable of setting up the interface between the apparatus and the electrical distribution network, and hence of fulfilling the bit-checking function. In both cases, when the transmission is made, the microprocessors must manage the transmission of the message as well as the checking of the message transmitted. What has to be done in this case, therefore, is to carry out tasks that are simultaneous.

In view of the speeds and bit rates that are brought into play, it is possible to choose fast microprocessors so as to obtain the processing, in time-sharing mode, of each of these tasks to give the impression that each of them is carried out at the same time as the other one. This is not always possible, except at the cost of having a fast microprocessor which in principle, therefore, is a more expensive microprocessor.

If this is not possible, then it is necessary, in the context of the existing technology, to find an applications specific circuit with a dedicated microprocessor that fulfills the required functions, some of which may be simultaneous. In the field of automated home installations, the number of these circuits to be designed is very large.

The present invention is aimed at making it easier to design these circuits and at placing a working tool at the disposal of the designers, enabling them to swiftly identify conflicts of resources (saturation of the microprocessor, or of the data, address or control buses) and to assess the extent to which certain parts of a circuit would have to be made in hardware form (wired circuit) instead of being made in software form with a single microprocessor-based circuit.

To resolve these problems, with the present invention, the function to be fulfilled by the specialized circuit to be designed is simulated essentially with a parallel architecture machine provided, in one example, with "Transputers." A parallel architecture machine provided with "Transputers" is a very powerful machine comprising, by virtue of its principle, several microprocessors, each microprocessor being capable of carrying out all the tasks that may be entrusted to it. The parallel architecture machine furthermore possesses its own programmer circuit or scheduler circuit which distributes the tasks to those microprocessors that it considers to be most suited to carrying them out: which, in practice, are those microprocessors that are available or those that are the closest to it, given their distribution in the integrated circuit of the transputer. With this being done, it is certain that all the tasks can be carried out, in view of the power of the parallel architecture machine.

In the present invention, all the distribution operations carried out by the scheduler circuit, notably their start and their end as well as the designation of the microprocessor chosen by the scheduler circuit, are observed and recorded in order to prepare a list of tasks to be performed. By consulting this list, the designer of the applications specific integration circuit can then make a speedier assessment of the circuit that will be best suited to carrying out the entire application. The ASIC circuit thus chosen could be adapted in terms of size and cost to the application envisaged. The list of tasks to be performed gives an indication, for each task, of the period of use of each of the microprocessors. The sum of these periods should be smaller, for example, than the period taken for the task if it is desired to choose a single microprocessor-based applications specific integrated circuit.

SUMMARY OF THE INVENTION

An object of the invention, therefore, is to provide a method to determine a composition of an ASIC type integrated circuit provided with an arithmetic and/or logic unit, a non-volatile program memory and one or more working registers. The method includes preparing a list of the tasks that the integrated circuit, to be determined, must be made to perform. Simulating a performance of these tasks in a parallel architecture machine, called a transputer-based machine, comprising a scheduler circuit connected to a plurality of microprocessor circuits to make them carry out tasks, this scheduler circuit receiving requests for performance of the tasks to be carried out, this scheduler circuit choosing, for the performance of each task, one of the microprocessor circuits which is most suited to carrying out the task, and this scheduler circuit then causing this task to be performed by this microprocessor circuit.

A chronology and duration of performance of the tasks distributed by the scheduler circuit are observed and recorded in order to examine that point in time, in this performance of the tasks, when there may be a conflict of processing resources, in order to determine the nature of the integrated circuit to be made.

An additional object of the invention is to provide a device to determine the composition of an ASIC type integrated circuit to be designed and provided with an arithmetic and/or logic unit, a non-volatile program memory and one or more working registers. The device includes a memory comprising a list of the tasks to be performed by the integrated circuit to be determined, a transputer-based, parallel architecture machine comprising a scheduler circuit connected to a plurality of microprocessor circuits to make them carry out tasks, this scheduler circuit receiving, requests for performance of the tasks, and a dedicated microprocessor coupled to the scheduler circuit, for recording points of origin, dates of requests for performance of the tasks, designations of the microprocessors, most suited to carrying out these tasks, that have been chosen by the scheduler circuit and end-of-performance dates.

BRIEF DESCRIPTION OF THE DRAWINGS

The invention will be understood more clearly from the following description, made with reference to the appended figures. These figures are given purely by way of an indication and in no way restrict the scope of the invention. Of these figures.

DETAILED DESCRIPTION

Figure 1:
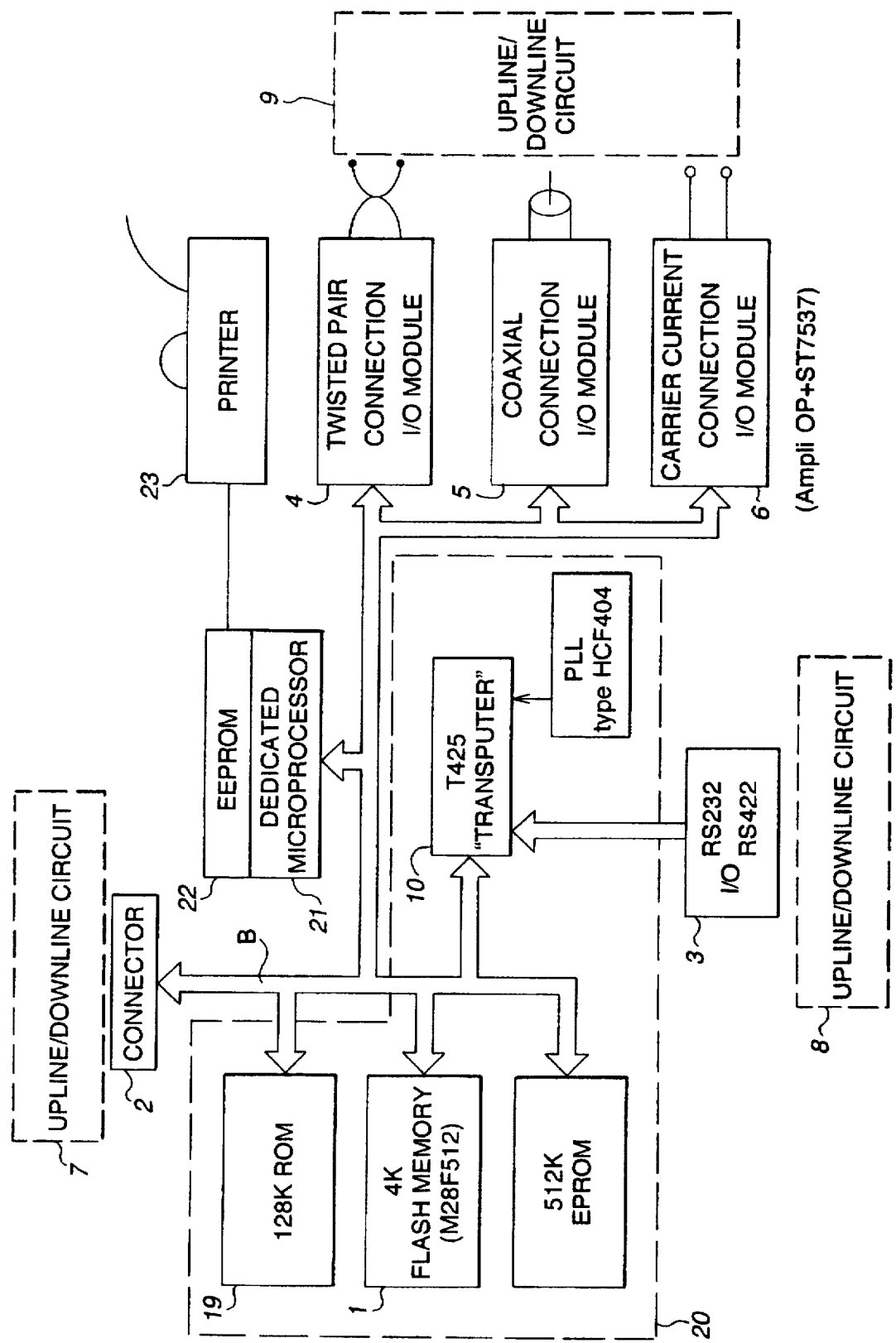
FIG. 1 shows a schematic drawing of a device that can be used to implement the method of the invention.

FIG. 1 shows a determining device according to the invention. A memory 1 contains a list of tasks that an integrated circuit, to be determined, must be made to perform. This list is constituted, for example, by a computer program that is preferably written in the C language and is designed to be translated to a language of the IEEE military standard known as VHDL (Very Hierarchical Description Language) published by the U.S. military authorities under No. 454 in 1984. This language, derived from the ADA language, was standardized in France in 1988 with a view to designing the ASIC type integrated circuits. The VHDL type language is implemented, for example, in a software program "CADENCE" produced by the firm CADENCE, U.S.A. and in another software program "MONTOR" which is also of U.S. origin. For a given use or application, therefore, there is already a known way of constituting the necessary instructions in a program.

The device of the invention also has ports such as 2 to 6, used as input ports or output ports. Port 2, for example, is a standard type of connector comprising, in a differentiated way, a control bus, a data bus, and an address bus. Port 3 is an RS232 or RS422 type interface with its integrated conversion protocol for transmitting signals over a limited number of wires. Ports 4, 5 and 6 are specialized ports respectively providing a connection of the circuit to transmission devices, the connections being set up respectively by means of twisted pairs, coaxial connections or carrier current lines. Other types of ports may be envisaged, notably for RF transmission or transmission by optic fiber.

These ports enable the connection of the upline circuits such as 7 to 9 to the integrated circuit. Should the integrated circuit, to be designed, relate to a motor, an upline circuit would be, for example, an ammeter to measure the throughput rate of the current flowing into the motor. In the case of digital measurements, it may be a tacho-generator coupled to the motor and delivering digital signals. The circuit of FIG. 1 simulates processing of the signals that it receives from these upline circuits 7 to 9 in applying the program contained in the memory 1. It then transmits the processed signals to downline circuits, herein circuits 7 to 9. For example, the downline circuit may be the circuit 8 and the upline circuit may be the circuit 9 or vice versa.

To simulate the tasks, the device of the invention comprises a parallel architecture machine constituted by a "Transputer," for example a T425 type "Transputer" supplied by the firm INMOS, U.K. This "Transputer" 10, these port circuits 2–6 and the different memories of the circuit are connected together by a general bus B.

Figure 2:
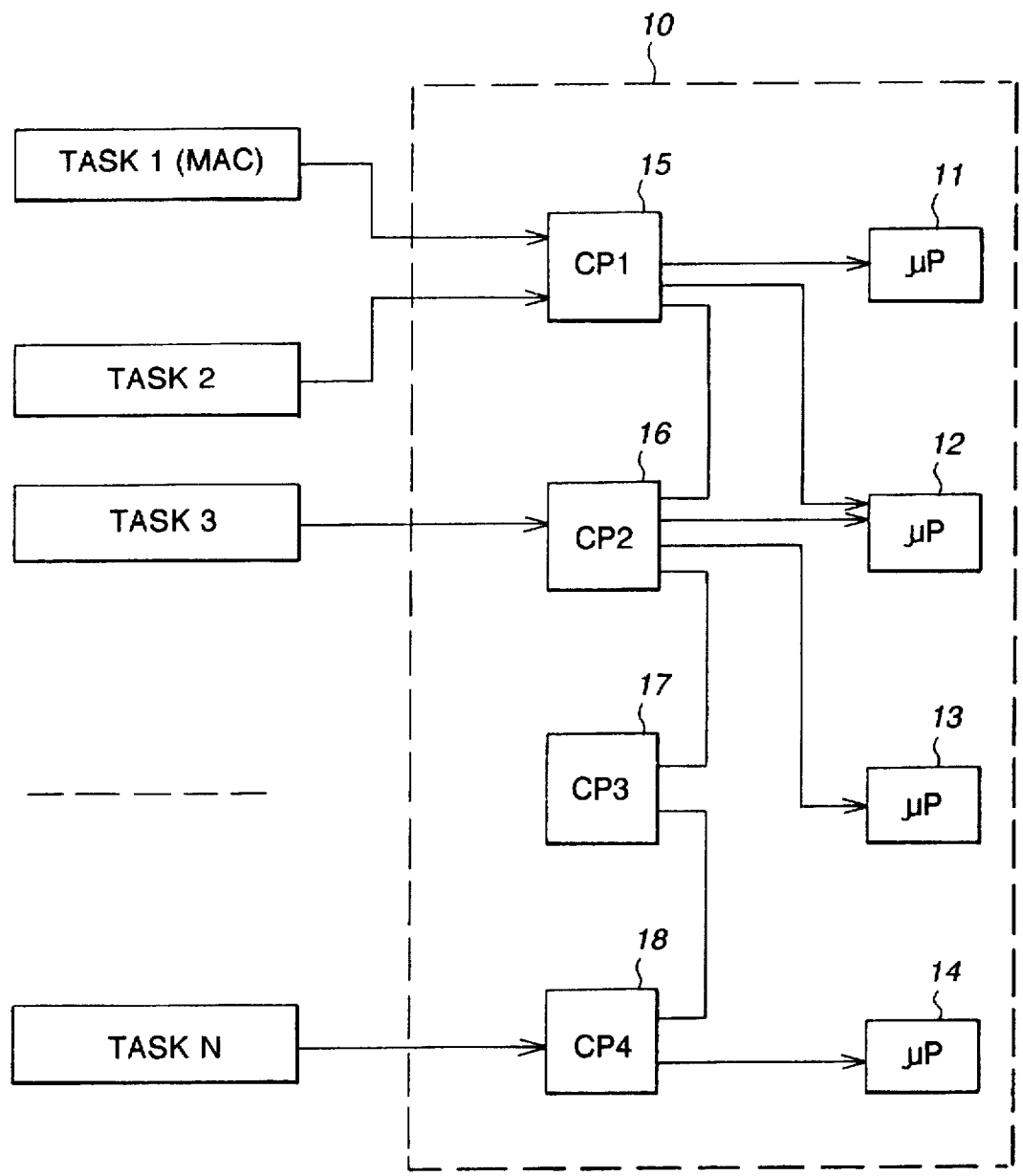
FIG. 2 shows a functional drawing of an exemplary configuration of a parallel architecture machine included within the device of FIG. 1.

FIG. 2 shows the principle of operation of a "Transputer" of this type. A "Transputer" 10 such as this has a certain number of microprocessors 11 to 14, each capable of carrying out a certain number of tasks such as receiving digital signals, processing them and transmitting them once their processing has been done. These circuits depend on one or more scheduler or programmer circuits, 15 to 18 respectively, responsible for assigning the performance of a task to one of the microprocessors.

For example, in its definition, a scheduler circuit 16 may make the microprocessor 12 or the microprocessor 13 perform the tasks that are submitted to it. Each of these microprocessors constitutes a resource of the parallel architecture machine. The scheduler circuits 15 to 18 allocate these resources to the performance of the different tasks. This allocation starts at a given time and continues until the task has been carried out by the concerned microprocessor. All the literature pertaining to these parallel architecture machines will be found in the data sheets provided with the "Transputers" marketed by the firm mentioned above. The program that enables the operation of the scheduler circuits 15 to 18 is contained in a program memory 19 (FIG. 1).

Referring to FIG. 1, there is shown an electronic card 20 comprising a "Transputer" 10 provided with its environment, and a supplementary microprocessor 21 responsible for monitoring of the commands transmitted by the scheduler circuits 15 to 18, or by a general scheduler circuit. The supplementary microprocessor is also connected to the bus B.

For the performance of a task, namely a task 1, an external circuit, for example a so-called MAC (medium access control) circuit comprising a bit-checking device, referred to above, sends an indication to the scheduler circuit 15 of its ability to send out a message on a line of a carrier current network, for example to go through a connection module 6. For a first part of the task 1, the scheduler circuit 15 will entrust the microprocessor 11 with the task of setting up a sequence of the commands needed to transfer the contents of a data memory from the MAC circuit to a modulator connected to the module 6, and to put this modulator into operation in order to modulate the digital signal before it is coupled to the carrier current line. Almost at the same time, the scheduler circuit 15 will receive another indication coming from the bit-checking device of the modulator, indicating that this modulator has detected the presence of the transmitted signal on the carrier current line. This transmitted signal is therefore checked. This is a second part of the task 1.

The scheduler circuit 15 thus has knowledge, at all times, of the status of the resources allocated to it, i.e. whether they are available or being used. With the sequence of the instructions transmitted to the microprocessor 11 (it is up to this microprocessor 11 to see to it that they are performed), the scheduler circuit 15 can assess the availability of the microprocessor 11. To carry out the checking of the bits, the scheduler circuit 11 may then entrust the same microprocessor 11 or another microprocessor 12 with the task of carrying out the different instructions that lead to this bit-checking function.

Continuing in this manner, for a given operation, the parallel architecture machine with its scheduler circuits and its microprocessors is capable, without difficulty, of carrying out all the tasks entrusted to it. This is always possible since the parallel architecture machine 10 is highly powerful. If need be, however, an even more powerful machine can be chosen.

With the supplemental microprocessor 21, the control buses of the scheduler circuit or circuits 15 to 18 are monitored, and a point of origin of the calls for action, for example those arising out of the request for the transmission or checking of the bits is detected. The dates and the points of origin of these requests are recorded in a memory 22, for example of the EEPROM type, that is directly coupled to the supplemental microprocessor 21. The supplemental microprocessor 21 makes a recording, also in the memory 22, along with the starting dates and the nature of the tasks begun, a designation of the microprocessor, 11 or 12, allocated by the scheduler circuit 15 to the performance of the task. After reception, at the end of the performance of the tasks, the external circuits sends digital signals used as acknowledgment messages. These acknowledgment messages are managed by the parallel architecture machine. The acknowledgment messages serve, for the microprocessor 21, notably to establish the fact that the concerned task has ended.

Once the task has been performed, it is possible, by means of a printer 23, to print the list memorized in the memory 22. Using this list, the circuit designer can more effectively choose the circuit that he wishes to have made. He has far more information available without having made any restrictive assumptions.

Figure 3:
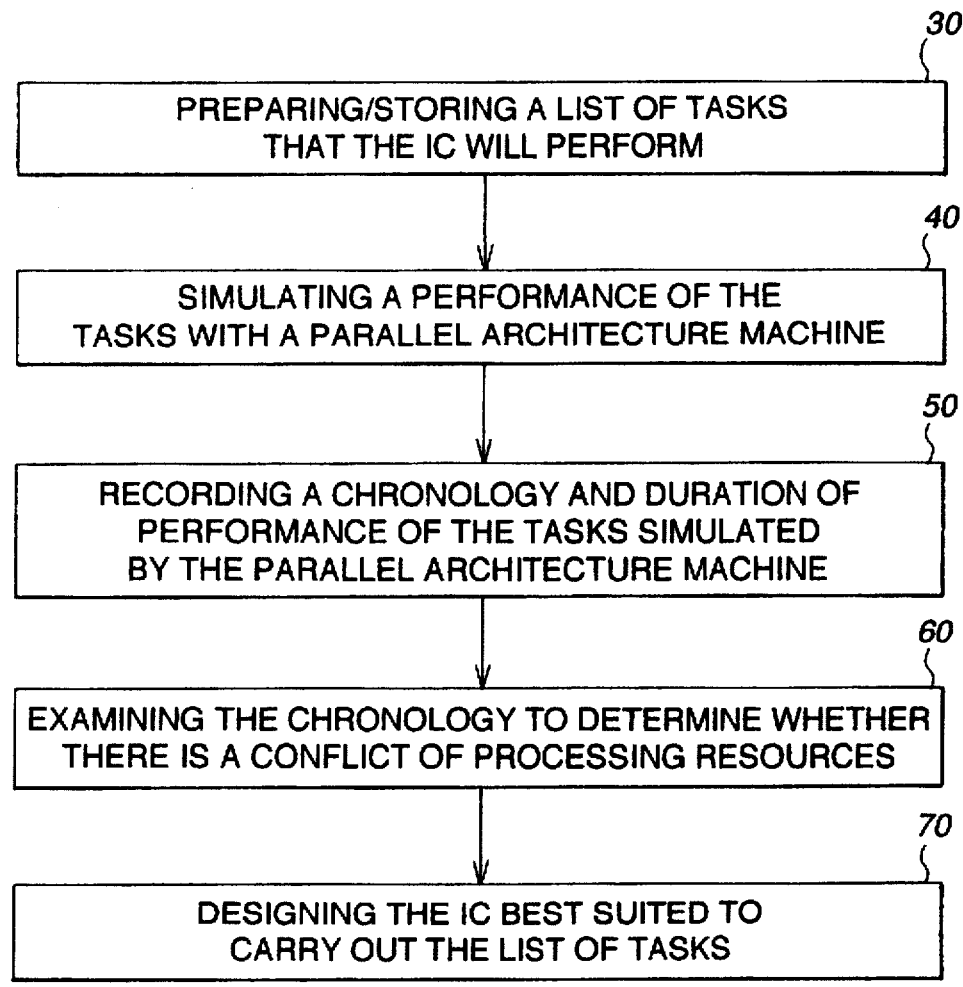
FIG. 3 is a flow chart of a method of designing an intergrated circuit according to the present invention.
Figure 4:
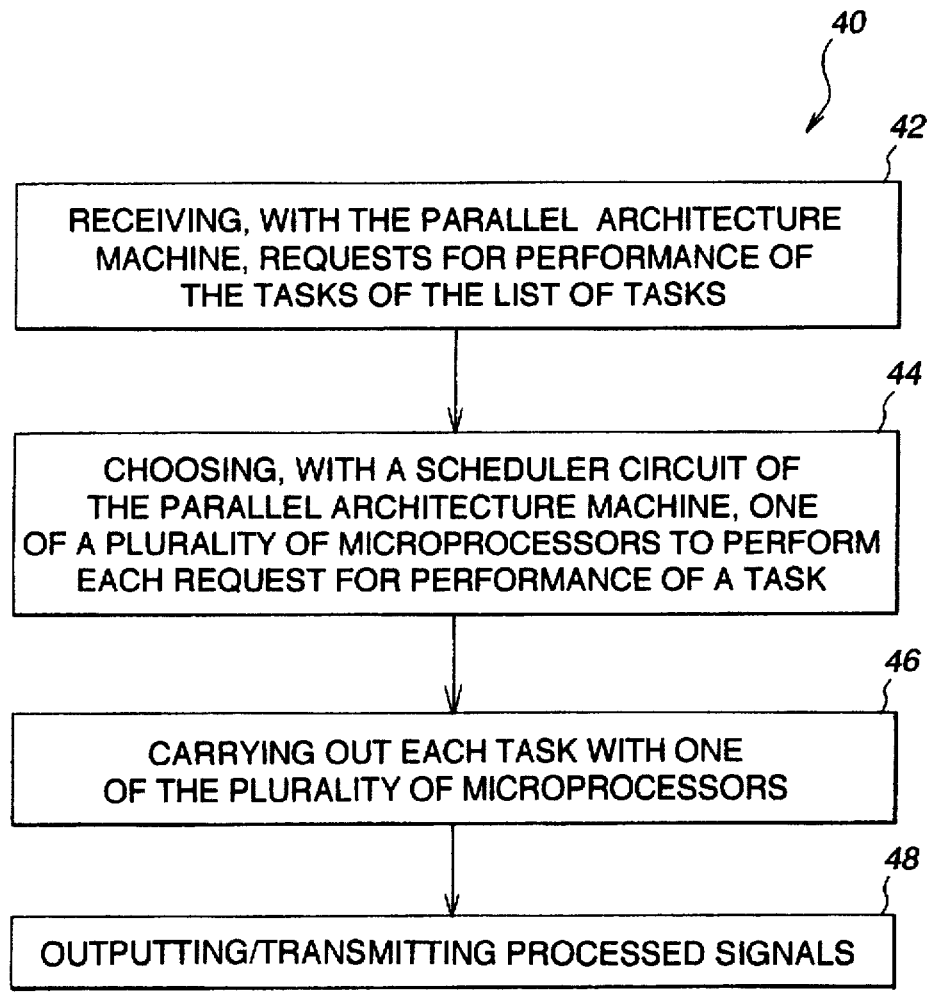
FIG. 4 is a detailed flow chart of a step of the method of FIG. 3.

In summary, referring to FIG. 3, an embodiment of a method for designing an integrated circuit according to the present invention includes preparing/storing a list of tasks that the integrated circuit to be designed will perform (Step 30), simulating a performance of the tasks with a parallel architecture machine (Step 40), recording a chronology and a duration of performance of the simulated tasks by the parallel architecture machine (Step 50), examining the chronology to determine whether there is a conflict of processing resources (Step 60), and designing the integrated circuit best suited to carry out the list of tasks (Step 70). In addition, referring to FIG. 4, the step of simulating the performance of the task with the parallel architecture machine (Step 40) includes receiving, with the parallel architecture machine, requests for performance of the tasks (Step 42), choosing, with a scheduler circuit of the parallel architecture machine, one of the plurality of microprocessors to perform each request for performance of a task (Step 44), carrying out each task with the one of the plurality of microprocessors (Step 46), and outputting/transmitting processed signals from each of the plurality of microprocessors to the downline circuits (Step 48).

As a variant, rather than providing for a specific supplemental microprocessor 21, the parallel architecture machine 10 can also be given the additional task of monitoring the directives given by the scheduler circuit or circuits 15–18. In this case, one of the microprocessors, the microprocessor 14 for example, may be entrusted with this specific task, namely the task N in FIG. 2. In this case, the hardware approach, illustrated in FIG. 1, using the microprocessor 21 is replaced by a software approach wherein the memory 1 is used to store the directives to be carried out.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is limited only as defined in the following claims and the equivalents thereto.

What is claimed is:

1. A method for determining elements of an ASIC type integrated circuit provided with at least an arithmetic and/or logic unit, a non-volatile program memory and one or more working registers, said method comprising the following steps of:

storing in a memory of a parallel architecture machine a list of tasks that the integrated circuit, to be designed, must be made to perform;

simulating a performance of these tasks with the parallel architecture machine having a scheduler circuit connected to a plurality of microprocessor circuits to make them carry out the tasks, wherein the scheduler circuit receives, from upline circuits, requests for performance of the tasks to be performed, chooses, for the performance of each task, one of the microprocessor circuits which is most suited to carry out the task, and directs the microprocessor to perform the task and to transmit processed signals to downline circuits; and observing with a dedicated microprocessor and recording in memory a chronology and duration of performance of the tasks distributed by the scheduler circuit so that the chronology and the duration, in this performance of the tasks, may be examined to determine whether there may be a conflict of processing resources and to determine the elements of the ASIC type integrated circuit to be made.

2. The method according to claim 1 wherein the step of observing and recording the chronology and duration of the performance of the tasks distributed by the scheduler circuit further includes:

recording, with the microprocessor dedicated to this task, points of origin, dates of requests for performance of the tasks to be performed, designations of the microprocessors, most suited to carrying out these tasks, that have been chosen by the scheduler circuit and end-of-performance dates of the requested tasks, wherein said end-of-performance dates are ascertained by means of the transmission of the processed data to the downline circuits; and printing these recordings out.

3. A device for determining elements of an ASIC type integrated circuit to be designed and to be provided with at least an arithmetic and/or logic unit, a non-volatile program memory and one or more working registers, wherein said device comprises:

a memory comprising a list of the tasks that the integrated circuit must be made to perform;

input ports which receive digital signals requesting performance of a task of the list of tasks given by circuits upline with respect to the ASIC type integrated circuit;

a transputer-based, parallel architecture machine comprising a scheduler circuit connected to a plurality of microprocessor circuits to make them carry out the list of tasks to provide processed signals, wherein the scheduler circuit receives, from the upline circuits, the requests for performance of the tasks to be performed;

output ports for transmitting the processed digital signals to circuits downline with respect to this ASIC type integrated circuit; and a dedicated microprocessor, coupled to the scheduler circuit, which is dedicated to recording points of origin, dates of the requests for performance of the tasks to be performed, designations of the microprocessors, most suited to carrying out these tasks, that have been chosen by the scheduler circuit and end-of-performance dates of the requested tasks which are indicated by transmission of the processed data elements to the downline circuits.

4. A device according to claim 3, wherein:

the dedicated microprocessor is one of the plurality of microprocessors of the parallel architecture machine.

5. A method for designing an integrated circuit, comprising the steps of:

storing in a memory of a parallel architecture machine a list of tasks to be performed by the integrated circuit;

simulating a performance of requested task signals, corresponding to the list of tasks with the parallel architecture machine which includes a scheduler circuit coupled to a plurality of microprocessor circuits, wherein the scheduler circuit receives the requested task signals from upline circuits, chooses one of the microprocessor circuits, and directs the chosen microprocessor circuit to perform the requested task signal and to transmit processed data to downline circuits; and recording in memory a chronology and duration of performance of the requested task signals so that the chronology may be examined to determine whether there exists a conflict of processing resources.

6. The method according to claim 5, wherein the step of recording the chronology and duration of performance of the requested task signals further includes recording, with a dedicated microprocessor coupled to the scheduler circuit, points of origin of the requested task signals, dates of requests for the requested task signals, designations of the microprocessors chosen by the scheduler circuit, and end-of-performance dates of the requested task signals.

7. The method according to claim 6, wherein the end-of-performance dates are ascertained by the transmission of the processed data to the downline circuits.

8. The method according to claim 6, wherein the step of recording the chronology and duration of performance of the requested task signals further includes the step of printing out the recorded information.

9. An apparatus for designing an integrated circuit, comprising:

a memory which stores a list of tasks to be performed by the integrated circuit;

at least one input port for receiving task signals of the list of tasks output by circuits upline with respect to the integrated circuit;

a parallel architecture machine having a scheduler circuit coupled to a plurality of microprocessor circuits, wherein the scheduler circuit receives the task signals from the upline circuits, and directs the parallel architecture machine to simulate the task signal and provide processed signals;

at least one output port for transmitting the processed signals to circuits downline with respect to the integrated circuit; and a dedicated microprocessor, coupled to the scheduler circuit, which records points of origin of the task signals, dates of the task signals, designations of the microprocessor which is chosen by the scheduler circuit to perform the requested task signals, an end-of-performance dates of the requested task signals.

10. The apparatus of claim 9, wherein the dedicated microprocessor is one of the plurality of microprocessor circuits.

11. The apparatus of claim 9, wherein the input and output ports are chosen from a list of twisted pair lines, coaxial connector lines, carrier current lines, and optical fibers.

12. The apparatus of claim 9, wherein the upline circuit is chosen from a list of an ammeter and a tacho-generator.

13. The apparatus of claim 9, wherein the scheduler circuit comprises a plurality of scheduler circuits coupled to the plurality of microprocessor circuits.

14. The apparatus of claim 9, which further includes a EEPROM directly coupled to the dedicated microprocessor.

15. A method for designing an integrated circuit, comprising the steps of:

creating a list of tasks to be performed by the integrated circuit;

simulating a performance of the tasks with a parallel architecture machine including a scheduler circuit coupled to a plurality of microprocessor circuits, wherein the scheduler circuit receives requests for the performance of the tasks of the list of tasks, chooses one of the microprocessor circuits, and directs the chosen microprocessor circuit to perform the requested task; and recording, with a dedicated microprocessor, a chronology and duration of performance of each of the requested tasks.

16. An apparatus for designing an integrated circuit, comprising:

means for storing a list of tasks to be performed by the integrated circuit;

a parallel architecture machine having a scheduler circuit coupled to a plurality of microprocessor circuits, wherein the scheduler circuit receives requests for performance of a task of the list of tasks compiles the lists of tasks, and directs the plurality of microprocessor circuits to simulate the requests for performance of the tasks; and a dedicated microprocessor, coupled to the scheduler circuits, which records a date of the request for performance of the list of tasks, a designation of a microprocessor chosen by the scheduler circuit to perform the requested task, and a date of completion of the requested task.

* * * * *